United States Patent
Kwon

(10) Patent No.: US 7,477,496 B2
(45) Date of Patent: Jan. 13, 2009

(54) HIGH INPUT VOLTAGE TOLERANT INPUT/OUTPUT CIRCUIT BEING FREE FROM ELECTROSTATIC DISCHARGE VOLTAGE

(75) Inventor: Bong-Jae Kwon, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 223 days.

(21) Appl. No.: 11/354,303

(22) Filed: Feb. 14, 2006

(65) Prior Publication Data

US 2006/0250735 A1   Nov. 9, 2006

(30) Foreign Application Priority Data

Feb. 14, 2005   (KR) .................... 10-2005-0011914

(51) Int. Cl.
  *H02H 9/00* (2006.01)
  *H02H 1/00* (2006.01)
(52) U.S. Cl. ...................................... 361/56
(58) Field of Classification Search .................. 361/56
   See application file for complete search history.

(56) References Cited

U.S. PATENT DOCUMENTS

| 5,917,336 | A | 6/1999 | Smith et al. | |
|---|---|---|---|---|
| 5,946,177 | A * | 8/1999 | Miller et al. | 361/56 |
| 6,075,271 | A | 6/2000 | Smith | |
| 6,657,835 | B2 | 12/2003 | Ker et al. | |
| 6,747,861 | B2 | 6/2004 | Ker et al. | |
| 2005/0041346 | A1* | 2/2005 | Wu et al. | 361/56 |

FOREIGN PATENT DOCUMENTS

JP    2003-264233    9/2003

* cited by examiner

*Primary Examiner*—Ronald W Leja
(74) *Attorney, Agent, or Firm*—F. Chau & Assoc., LLC

(57) ABSTRACT

A high input voltage tolerant input/output circuit includes a pad, a clamping circuit clamping a high voltage applied to the pad to generate a clamping signal, and a buffer unit transmitting an input signal received by the pad to an internal circuit and outputting data of the internal circuit to the pad in response to the clamping signal. The buffer unit includes stacked NMOS transistors. When a high voltage higher than a power supply voltage is applied to the pad, the stacked NMOS transistors are turned on, and the stacked NMOS transistors are prevented from being destroyed by the high voltage. When an electrostatic discharge voltage is applied to the pad, the stacked NMOS transistors are turned off, and the stacked NMOS transistors are prevented from being destroyed by electrostatic discharge current.

6 Claims, 3 Drawing Sheets

US 7,477,496 B2

HIGH INPUT VOLTAGE TOLERANT INPUT/OUTPUT CIRCUIT BEING FREE FROM ELECTROSTATIC DISCHARGE VOLTAGE

CROSS-REFERENCE TO RELATED APPLICATIONS

This application claims priority to Korean Patent Application No. 10-2005-0011914, filed on Feb. 14, 2005, the disclosure of which is herein incorporated by reference in its entirety.

BACKGROUND OF THE INVENTION

1. Technical Field

The present invention relates to a semiconductor integrated circuit and, more particularly, to a high input voltage tolerant input/output circuit being free from electrostatic discharge (ESD) voltage.

2. Description of the Related Art

Semiconductor devices comprising circuits that operate on a low-voltage power supply and circuits that operate on a high-voltage power supply are known. There are semiconductor device manufacturers producing 3V products (3V referring to any low operating voltage device). There are manufacturers producing components that take 5V power. It can be desirable to interface, for example, 3V and 5V devices in a mixed voltage system that is high input voltage tolerant.

FIG. 1 is a circuit diagram illustrating a conventional high input voltage tolerant input/output circuit 1. Referring to FIG. 1, first and second PMOS transistors 12 and 14 are parallel connected between a power supply voltage VDD and a pad 10. First and second NMOS transistors 16 and 18 are serially connected between the pad 10 and a ground voltage VSS. The second NMOS transistor 18 is parallel connected to a third NMOS transistor 19. A first internal signal PG is received by the gates of the first and second PMOS transistors 12 and 14, and a second internal signal NG is received by the gates of the second and third NMOS transistors 18 and 19. The gate of the first NMOS transistor 16 is connected to the power supply voltage VDD. An output signal having a predetermined output voltage is output to the pad 10 in response to the first and second internal signals PG and NG. An input signal received by the pad 10 is transmitted to an internal circuit.

In the conventional high input voltage tolerant input/output circuit 1, when a high voltage such as 5V is applied to the pad 10 at power supply voltage VDD of 3.3V, the gate of the first NMOS transistor 16 is connected to the 3.3V power supply voltage VDD and a voltage of 1.7V is applied to a gate oxide film of the first NMOS transistor 16. Hence, the first NMOS transistor 16 is stable when 5V is applied to the pad 10.

However, when an electrostatic discharge (ESD) voltage of several hundreds or thousands of Volts is applied to the pad 10 during a test for ESD voltage, the first NMOS transistor 16 is destroyed. As shown by the path labeled "A" in FIG. 1, positive ESD voltage applied to the pad 10 is discharged to the power supply voltage VDD via a P-N diode formed as a junction between the first and second PMOS transistors 12 and 14. When this occurs, the EDS voltage is applied to the gate of the first NMOS transistor 16 because the power supply voltage VDD is connected to the gate, and the gate oxide film is destroyed. On the other hand, as shown by the path labeled "B", a negative ESD voltage is discharged to the ground voltage VSS via an N-P diode formed as a junction between the first and second NMOS transistors 16 and 18.

There remains a need for a high input voltage tolerant input/output circuit being free from ESD voltage.

SUMMARY OF THE INVENTION

Exemplary embodiments of the present invention provide an input/output circuit being free from electrostatic discharge (ESD) voltage.

According to an exemplary embodiment of the present invention, an input/output circuit includes a pad; a clamping circuit clamping a high voltage applied to the pad to generate a clamping signal; and a buffer unit transmitting an input signal received by the pad to an internal circuit and outputting data of the internal circuit to the pad in response to the clamping signal.

According to an exemplary embodiment of the present invention, the clamping circuit includes: a first bias unit including a plurality of diodes serially connected to the power supply voltage; a first resistor connected between the first bias unit and the ground voltage; a second resistor connected between the power supply voltage and the clamping signal; and an NMOS transistor connected between the clamping signal and the ground voltage and having a gate to which a connection node between the first bias unit and the first resistor is connected.

According to another exemplary embodiment of the present invention, the clamping circuit includes: a capacitor connected to the power supply voltage; a first resistor connected between the capacitor and the ground voltage; a second resistor connected between the power supply voltage and the clamping signal; and an NMOS transistor connected between the clamping signal and the ground voltage and having a gate to which a connection node between the capacitor and the first resistor is connected.

The buffer unit may include: a first PMOS transistor and a second PMOS transistor parallel connected between a power supply voltage and the pad, receiving a first internal signal via gates of the first and second PMOS transistors; a first NMOS transistor having a drain to which the pad is connected and a gate to which the clamping signal is connected; a second NMOS transistor having a drain to which a source of the first NMOS transistor is connected and a gate and a source connected to a ground voltage; and a third NMOS transistor having a drain to which the source of the first NMOS transistor is connected, a gate to which a second internal signal is connected, and a source to which the ground voltage is connected.

BRIEF DESCRIPTION OF THE DRAWINGS

The present invention will become more apparent to those of ordinary skill in the art when descriptions of exemplary embodiments thereof are read with reference to the accompanying drawings, of which.

DETAILED DESCRIPTION OF THE EXEMPLARY EMBODIMENTS

Figure 1:
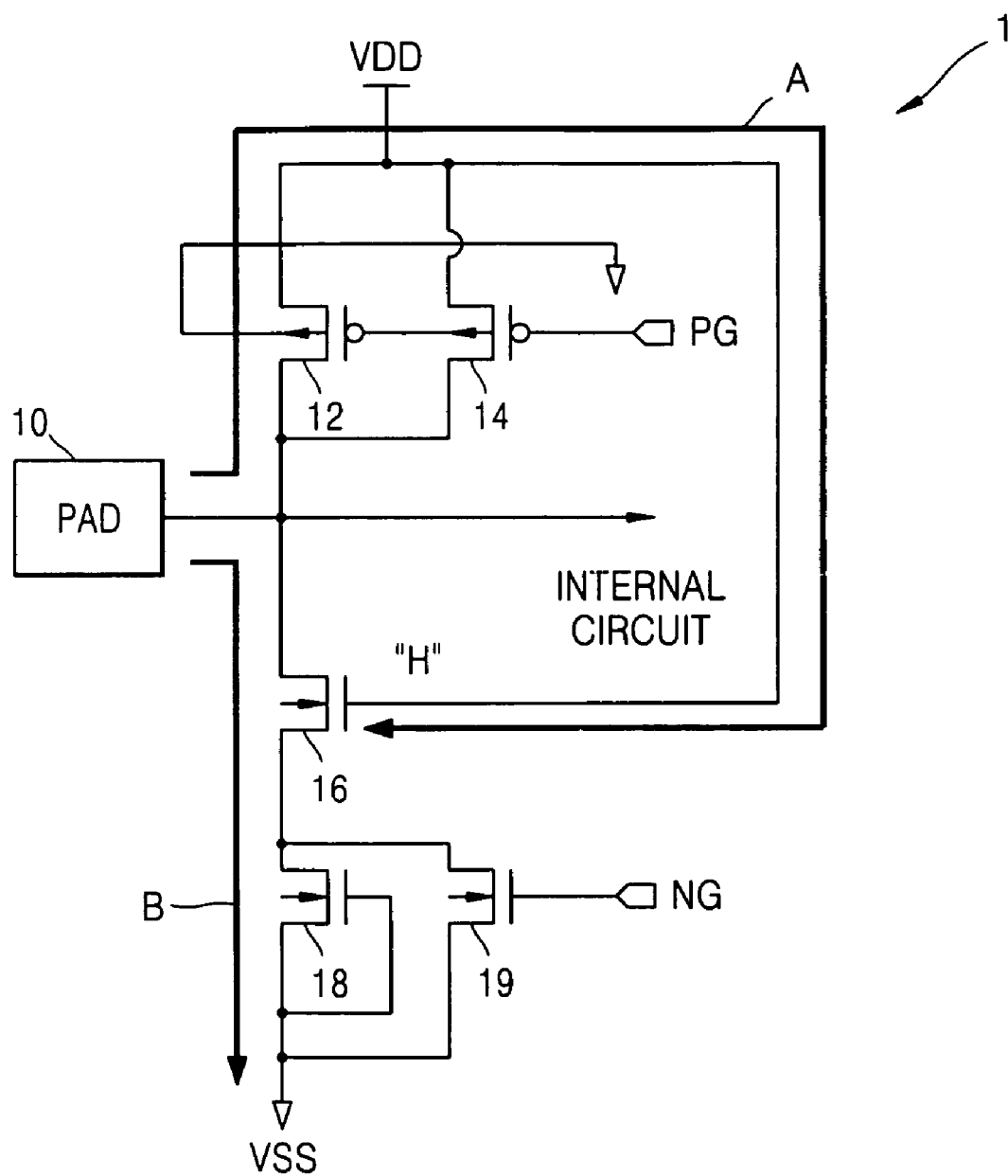
FIG. 1 is a circuit diagram illustrating a conventional high input voltage tolerant input/output circuit 1.

Hereinafter, the exemplary embodiments of the present invention will be described in detail with reference to the accompanying drawings. Like reference numerals refer to similar or identical elements throughout the description of the figures.

Figure 2:
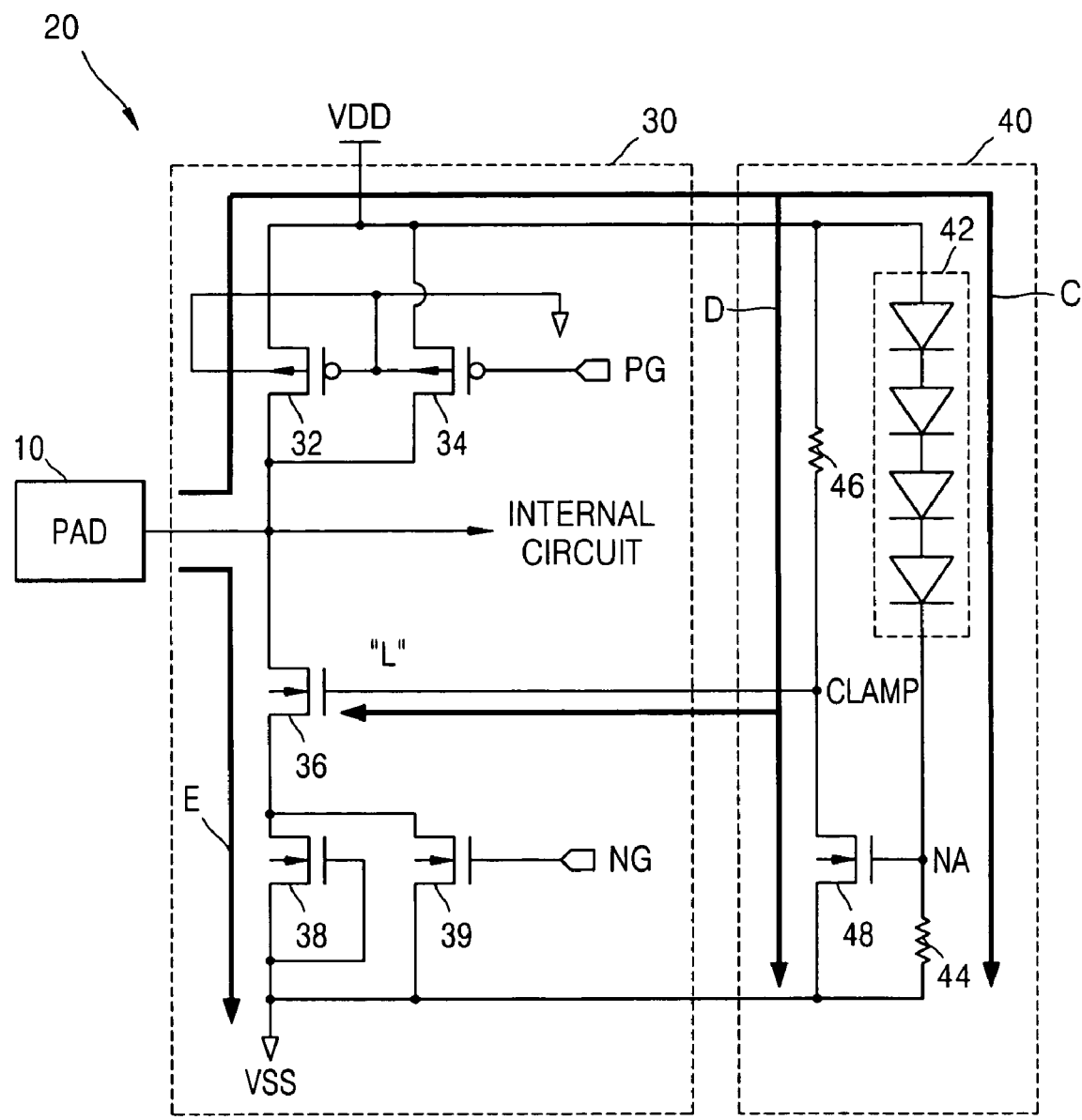
FIG. 2 is a circuit diagram illustrating a high input voltage tolerant input/output circuit according to an exemplary embodiment of the present invention.

FIG. 2 is a circuit diagram illustrating a high input voltage tolerant input/output circuit 20 according to an exemplary embodiment of the present invention. The high input voltage tolerant input/output circuit 20 includes a pad 10, a buffer unit 30, and a clamping circuit 40.

The buffer unit 30 is parallel connected between a power supply voltage VDD and the pad 10. The buffer unit 30 includes first and second PMOS transistors 32 and 34, which receive a first internal signal PG through their gates, a first NMOS transistor 36 having a drain to which the pad is connected and a gate to which a clamping signal CLAMP is connected, a second NMOS transistor 38 having a drain to which a source of the first NMOS transistor 36 is connected and a gate and a source connected to a ground voltage VSS, and a third NMOS transistor 39 having a drain to which the source of the first NMOS transistor 36 is connected, a gate to which a second internal signal NG is connected, and a source to which the reference voltage level VSS is connected. The reference voltage level VSS may be electrically connected to a ground terminal (not shown).

The clamping circuit 40 includes a first bias unit 42, including a plurality of diodes serially connected to the power supply voltage VDD, a first resistor 44, which is connected between the first bias unit 41 and the reference voltage level VSS, a second resistor 46, which is connected between the power supply voltage VDD and the clamping signal CLAMP, and a fourth NMOS transistor 48, which is connected between the clamping signal CLAMP and the reference voltage level VSS and has a gate to which a connection node NA between the first bias unit 42 and the first resistor 44 is connected.

In a normal operation of the high input voltage tolerant input/output circuit 20, the connection node NA between the first bias unit 42 and the first resistor 44 of the clamping circuit 40 is set to have a voltage level that turns off the fourth NMOS transistor 48. When the fourth NMOS transistor 48 is turned off, the clamping signal CLAMP has the same logic high level as the level of the power supply voltage VDD. In response to the logic-high clamping signal CLAMP, the first NMOS transistor 36 of the buffer unit 30 is turned on. Accordingly, in an output mode, the buffer unit 30 outputs output data to the pad 10 in response to the first and second internal signals PG and NG. In an input mode, the buffer unit 30 transmits an input signal received by the pad 10 to an internal circuit. When a voltage of the input signal received by the pad 10 is a high voltage that is greater than the power supply voltage VDD, for example, when the power supply voltage VDD is 3.3V and the input signal has about 5V, a voltage of 1.7V is applied to a gate oxide film of the first NMOS transistor 36 because the power supply voltage VDD is applied to the gate of the first NMOS transistor 36, and the first NMOS transistor 36 is stable.

In an abnormal operation of the high input voltage tolerant input/output circuit 20, when a positive electrostatic discharge (ESD) voltage is applied to the pad 10, the positive ESD voltage is discharged to the power supply voltage VDD via a P-N diode formed as a junction between the first and second PMOS transistors 32 and 34. When the level of the power supply voltage VDD increases up to about the ESD voltage, ESD current flows toward the first bias unit 42 and the first resistor 44 via path C. The level of a voltage applied to the second resistor 44 increases, and the fourth NMOS transistor 48 is turned on. The clamping signal CLAMP has the same logic low level as the level of the reference voltage level VSS. The first NMOS transistor 36 of the buffer unit 30 is turned off in response to the logic-low clamping signal CLAMP, and the electron current induced by the ESD voltage applied to the pad 10 is not concentrated into the first NMOS transistor 36. The first NMOS transistor 36 is protected from the positive ESD voltage. When a negative ESD voltage is applied to the pad 10, the negative ESD voltage is discharged to the reference voltage level VSS via an N-P diode formed as a junction between the first and second NMOS transistors 36 and 38 via path E.

Figure 3:
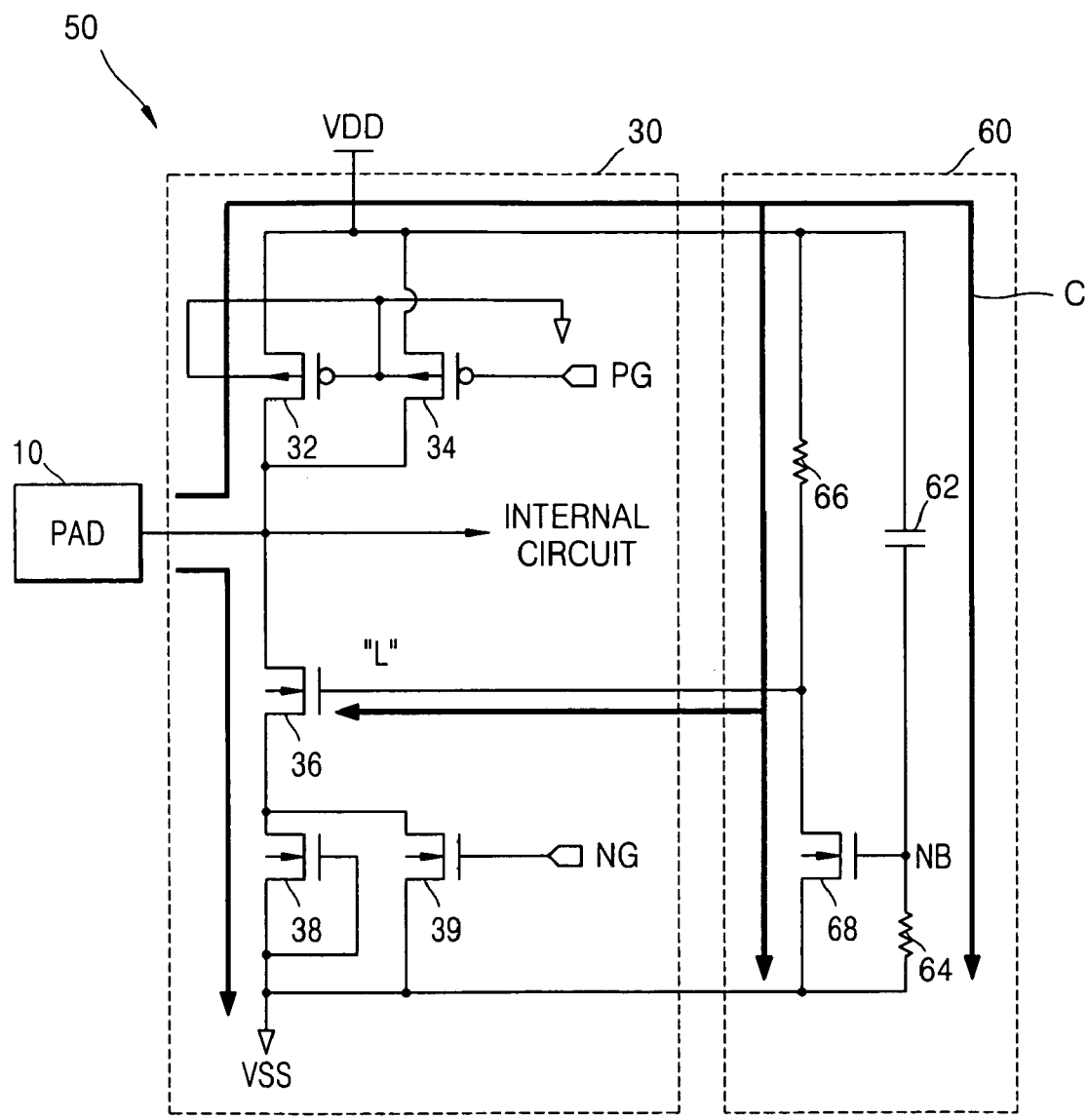
FIG. 3 is a circuit diagram illustrating a high input voltage tolerant input/output circuit with high according to another exemplary embodiment of the present invention.

FIG. 3 is a circuit diagram illustrating a high input voltage tolerant input/output circuit 50 according to another exemplary embodiment of the present invention. The tolerant input/output circuit 50 includes a pad 10, a buffer unit 30, and a clamping circuit 60. Since the high input voltage tolerant input/output circuit 50 includes the pad 10 and buffer unit 30 of the high input voltage input/output circuit 20 of FIG. 2, further description of the pad 10 and the buffer unit 30 is omitted in the interests of clarity and simplicity.

The clamping circuit 60 includes a capacitor 62 connected to a power supply voltage VDD, a first resistor 64 connected between the capacitor 62 and a reference voltage level VSS, a second resistor 66 connected between the power supply voltage VDD and a clamping signal CLAMP, and a fourth NMOS transistor 68 connected between the clamping signal CLAMP and the reference voltage level VSS and having a gate to which a connection node NB between the capacitor 62 and the first resistor 64 is connected. The reference voltage level VSS may be electrically connected to a ground terminal (not shown).

In a normal operation of the high input voltage tolerant input/output circuit 50, the connection node NB between the capacitor 62 and the first resistor 64 of the clamping circuit 60 has the same level as the logic low level of the reference voltage level VSS. The fourth NMOS transistor 68 is turned off by the logic low connection node NB. The clamping signal CLAMP has the same logic high level as the level of the power supply voltage VDD.

In an abnormal operation of the input/output circuit 50, when a positive ESD voltage is applied to the pad 10, the positive ESD voltage is discharged to the power supply voltage VDD via a P-N diode formed as a junction between the first and second PMOS transistors 32 and 34. When the level of the power supply voltage VDD increases up to about the positive ESD voltage, ESD current flows toward the capacitor 62 and the first resistor 64 via path C. The ESD current increases the level of a voltage applied to the second resistor 64 while the capacitor 62 is charged with the ESD current. The fourth NMOS transistor 68 is turned on. The clamping signal CLAMP has the same logic low level as the level of the reference voltage level VSS.

In accordance with exemplary embodiments of the present invention, when a high voltage that is higher than a power supply voltage is applied to the pad, the stacked NMOS transistors are turned on, and the stacked NMOS transistors are prevented from being destroyed by the high voltage. When an electrostatic discharge voltage is applied to the pad, the stacked NMOS transistors are turned off, and the stacked NMOS transistors are prevented from being destroyed by electrostatic discharge current.

Although the exemplary embodiments of the present invention have been described with reference to the accompanying drawings for the purpose of illustration, it is to be understood that the inventive processes and apparatus are not to be construed as limited thereby. It will be readily apparent to by those of ordinary skill in the art that various modifications to the foregoing exemplary embodiments may be made without departing from the scope of the invention as defined by the appended claims, with equivalents of the claims to be included therein.

What is claimed is:

1. An input/output circuit comprising:
   a buffer unit including a pad, a pair of PMOS transistors connected to a power supply voltage, and a plurality of stacked NMOS transistors and transmitting an input signal received by the pad to an internal circuit and outputting data of the internal circuit to the pad in response to internal signals fed thereto; and
   a clamping circuit connected to the buffer and the power supply voltage and producing a clamping signal, whereby when high voltage higher than the power supply voltage is applied to the pad the stacked NMOS transistors are turned on and prevented from being destroyed by the high voltage and when an electrostatic discharge voltage is applied to the pad, the stacked NMOS transistors are turned off and prevented from being destroyed by the electrostatic discharge voltage.

2. The input/output circuit of claim 1, wherein the pair of PMOS transistors comprises:
   a first PMOS transistor and a second PMOS transistor parallel connected between the power supply voltage and the pad, receiving a first one of the internal signals via gates of the first and second PMOS transistors; and
   the stacked NMOS transistors comprise:
   a first NMOS transistor having a drain to which the pad is connected and a gate to which the clamping signal is connected;
   a second NMOS transistor having a drain to which a source of the first NMOS transistor is connected, a gate and a source each connected to a reference voltage level; and
   a third NMOS transistor having a drain to which the source of the first NMOS transistor is connected, a gate to which a second one of the internal signals is connected, and a source to which the reference voltage level is connected.

3. The input/output circuit of claim 1, wherein the clamping circuit comprises:
   a first bias unit including a plurality of diodes serially connected to the power supply voltage;
   a first resistor connected between the first bias unit and a reference voltage level;
   a second resistor connected between the power supply voltage and the clamping signal; and
   an NMOS transistor connected between the clamping signal and the reference voltage level and having a gate to which a connection node between the first bias unit and the first resistor is connected.

4. The input/output circuit of claim 1, wherein the clamping circuit comprises:
   a capacitor connected to the power supply voltage;
   a first resistor connected between the capacitor and a reference voltage level;
   a second resistor connected between the power supply voltage and the clamping signal; and
   an NMOS transistor connected between the clamping signal and the reference voltage level and having a gate to which a connection node between the capacitor and the first resistor is connected.

5. An input/output circuit comprising:
   a pad;
   a first PMOS transistor and a second PMOS transistor parallel connected between a power supply voltage and the pad, receiving a first internal signal via gates of the first and second PMOS transistors;
   a first NMOS transistor having a drain to which the pad is connected and a gate to which a clamping signal is connected;
   a second NMOS transistor having a drain to which a source of the first NMOS transistor is connected, a gate and a source each connected to a reference voltage level;
   a third NMOS transistor having a drain to which the source of the first NMOS transistor is connected, a gate to which a second internal signal is connected, and a source to which the reference voltage level is connected;
   a clamping circuit producing a clamping signal and including:
   a first bias unit including a plurality of diodes serially connected to the power supply voltage;
   a first resistor connected between the first bias unit and the reference voltage level;
   a second resistor connected between the power supply voltage and the clamping signal; and
   a fourth NMOS transistor connected between the clamping signal and the reference voltage level and having a gate to which a connection node between the first bias unit and the first resistor is connected,
   whereby when a high voltage higher than the power supply voltage is applied to the pad, the stacked NMOS transistors are turned on and are prevented from being destroyed by the high voltage, and when an electrostatic discharge signal is applied to the pad, the stacked NMOS transistors are turned off and the stacked NMOS transistors are prevented from being destroyed by the electrostatic discharge voltage.

6. An input/output circuit comprising:
   a pad;
   a first PMOS transistor and a second PMOS transistor parallel connected between a power supply voltage and the pad, receiving a first internal signal via gates of the first and second PMOS transistors;
   a first NMOS transistor having a drain to which the pad is connected and a gate to which a clamping signal is connected;
   a second NMOS transistor having a drain to which a source of the first NMOS transistor is connected, a gate and a source each connected to a reference voltage level;
   a third NMOS transistor having a drain to which the source of the first NMOS transistor is connected, a gate to which a second internal signal is connected, and a source to which the reference voltage level is connected;
   a clamping circuit producing a clamping signal and including:
   a capacitor connected to the power supply voltage;
   a first resistor connected between the capacitor and the reference voltage level;
   a second resistor connected between the power supply voltage and the clamping signal; and
   a fourth NMOS transistor connected between the clamping signal and the reference voltage level and having a gate to which a connection node between the capacitor and the first resistor is connected,
   whereby when a high voltage higher than the power supply voltage is applied to the pad, the stacked NMOS transistors are turned on and are prevented from being destroyed by the high voltage, and when an electrostatic discharge signal is applied to the pad, the stacked NMOS transistors are turned off and the stacked NMOS transistors are prevented from being destroyed by the electrostatic discharge voltage.

* * * * *